United States Patent [19]

Boardman et al.

[11] 3,924,520

[45] Dec. 9, 1975

[54] PREPARING LITHOGRAPHIC PLATES UTILIZING VINYL MONOMERS CONTAINING HYDROLYZABLE SILANE GROUPS

[75] Inventors: Harold Boardman, Chadds Ford, Pa.; David S. Breslow, Wilmington, Del.; David A. Simpson, Wilmington, Del.; Richard L. Wagner, Wilmington, Del.

[73] Assignee: Hercules Incorporated, Wilmington, Del.

[22] Filed: June 27, 1974

[21] Appl. No.: 483,844

[52] U.S. Cl. .................................. 96/33; 96/115 P
[51] Int. Cl.[2] ........................................ G03F 7/02
[58] Field of Search ........................... 96/33, 115 P

[56] References Cited

UNITED STATES PATENTS

| | | | |
|---|---|---|---|
| 3,163,534 | 12/1964 | Adams et al. | 96/33 |
| 3,606,922 | 9/1971 | Doggett | 96/33 |
| 3,615,538 | 10/1971 | Peters et al. | 96/33 |
| 3,782,940 | 1/1974 | Ohto et al. | 96/115 P |

*Primary Examiner*—Norman G. Torchin
*Assistant Examiner*—Judson R. Hightower
*Attorney, Agent, or Firm*—Marion C. Staves

[57] ABSTRACT

It has been found that photopolymer elements, particularly lithographic printing plates, can be prepared by (a) treating the surface of a polymer film with a photooxygenation sensitizer, said film being a film of a polymer containing extralinear olefinic unsaturation of the type in which there is no more than one hydrogen atom on each of the double bond carbons and in which there is at least one allylic hydrogen on at least one of the carbon atoms adjacent to the double bond carbons, which allylic hydrogen is not a bridgehead carbon, (b) exposing imagewise the sensitized film to light having a wave length from about 2,000 to about 12,000 angstroms in the presence of oxygen, (c) subjecting the exposed film to contact with a vinyl monomer containing a hydrolyzable silane group to effect graft polymerization of the vinyl silane monomer onto the light exposed areas of the polymer film, (d) removing ungrafted vinyl silane monomer from unexposed areas of the polymer film, (e) hydrolyzing the silane groups of the vinyl silane monomers grafted to the polymer film, and (f) amplifying the hydrophilicity of the hydrolyzed silane groups by treating with at least one amplifying agent selected from soluble silicate solutions and colloidal silica dispersions.

8 Claims, No Drawings

PREPARING LITHOGRAPHIC PLATES UTILIZING VINYL MONOMERS CONTAINING HYDROLYZABLE SILANE GROUPS

This invention relates to photopolymer compositions and to photopolymer elements, for example, plates embodying a layer of such compositions. More particularly, this invention relates to a method for preparing lithographic printing plates by grafting vinyl monomers containing hydrolyzable silane groups onto polymer substrates which have been photochemically oxidized and then amplifying the hydrophilicity of the hydrolyzed silane groups.

Compositions capable of being converted under the influence of actinic light ro rigid, insoluble, tough structures have become increasingly important in the preparation of printing elements. One of the fundamental patents relating to such compositions is U.S. Pat. No. 2,760,863 to Plambeck. In the process of the Plambeck patent printing elements are produced directly by exposing to actinic light through an image bearing process transparency a layer of an essentially transparent composition containing an addition polymerizable, ethylenically unsaturated monomer and an addition polymerization initiator activatable by actinic light. The layer of polymerizable composition is supported on a suitable support, and exposure of the composition is continued until substantial polymerization of the composition has occurred in the exposed areas with substantially no polymerization occurring in the nonexposed areas. The unchanged material in the latter areas then is removed, as by treatment with a suitable solvent in which the polymerized composition in the exposed areas is insoluble. In the case of printing plates, this results in a raised relief image which corresponds to the transparent image of the transparency and which is suitable for use in letterpress and dry offset work.

While extremely useful in the preparation of relief printing elements, lithographic printing elements and images from dry transfer processes, certain of the photopolymer compositions of the types disclosed by the Plambeck patent become less sensitive to actinic light due to the diffusion of oxygen from the air into the photopolymer layer. The oxygen acts to inhibit the desired polymerization and crosslinking reactions. There are means of removing or preventing oxygen from saturating or desensitizing the photopolymer layer. One way is to store or treat the element in an essentially oxygen-free atmosphere of an inert gas such as carbon dioxide. This technique gives satisfactory results but requires special equipment and is time consuming. It also is known to add certain metal compounds such as tin salts, which are soluble in the photopolymer composition but which are non-reactive with the addition polymerization initiator. While a number of these compounds substantially reduce the influence of oxygen and improve the photographic speed of the photopolymer element, their utilization has not been entirely satisfactory.

Now, in accordance with this invention, there has been discovered a process for the preparation of printing plates, particularly lithographic plates, including lithographic camera plates, which process is not inhibited by oxygen. As a matter of fact, the process depends upon oxygen being present during the exposure step. The process comprises the steps of providing the surface of an oleophilic polymer film with a photooxygenation sensitizer, said film being a film of a polymer containing extralinear olefinic unsaturation of the type in which there is no more than one hydrogen atom on each of the double bond carbons and in which there is at least one allylic hydrogen on at least one of the carbons adjacent to the double bond carbons, which allylic hydrogen is not on a bridgehead carbon, exposing selected areas of the sensitized film to light having a wave length of from about 2,000 to about 12,000 angstroms in the presence of oxygen and subjecting the exposed film to contact with a vinyl monomer containing a hydrolyzable silane group, which monomer is capable of forming a graft polymer structure in the exposed areas of the film. The silane group of the grafted monomer is then hydrolyzed, and the hydrophilic character of the hydrolyzed group amplified by treatment of the surface of the polymer film with a soluble silicate solution or a colloidal silica dispersion.

Within the meaning of this invention, oleophilic means a surface which accepts greasy ink and hydrophilic means a surface which accepts water. Moreover, a hydrophilic reactant is one which is capable of forming a surface which accepts water, and an oleophilic reactant is one which is capable of forming a surface which accepts ink. The vinyl monomer reactant of the present invention, although oleophilic, is potentially hydrophilic, since the silane group thereof is hydrolyzable to provide a hydrophilic surface. The exposed film, after being grafted with the vinyl monomer and subjected to treatment to effect hydrolysis of the silane groups, is further contacted with a soluble silicate solution or a colloidal silica dispersion in water. This final step is one of amplification and is utilized to increase the hydrophilic character of the light-struck areas and to increase the wear resistance and mass of these areas. The amplification and silane group hydrolysis steps may be carried out simultaneously.

More specifically, the process of this invention is one of preparing lithographic printing plates of good quality by (1) photooxidizing imagewise an oleophilic, extralinearly unsaturated polymer substrate, (2) grafting a vinyl monomer containing a hydrolyzable silane group onto the oxidized surface of the substrate, (3) washing away non-grafted vinyl monomer, (4) hydrolyzing the silane groups of the grafted monomer to form hydrophilic surfaces in those areas where oxidation and grafting have occurred, and (5) amplifying the hydrophilicity of the hydrolyzed silane groups by treating the polymer substrate with a soluble silicate solution or a colloidal silica dispersion. The initial reaction of the process of this invention involves the photosensitized oxidation of a suitably substituted, unsaturated polymer, resulting in the formation of hydroperoxide groups on or near the surface of the polymer film. The polymer hydroperoxides formed in the light-struck areas of the film are used to graft polymerize a vinyl monomer containing a hydrolyzable silane group onto the surface of the film. Hydrolysis of the silane group causes the area which was exposed to light to become hydrophilic. This hydrophilic character of the grafted areas is then amplified by treating the surface with a silicate solution or colloidal silica dispersion.

The polymers used in the process of this invention preferably are oleophilic, and they should be capable of being formed into durable, solvent-resistant films. Most amorphous polymers with a second order transition temperature below 50°C. must be crosslinked to some degree to provide the necessary solvent resistance. They should contain at least 0.01%, and preferably at least 0.2%, by weight of extralinear olefinic unsaturation of the type in which there is no more than one hydrogen atom on each of the double bond carbons and in which there is at least one allylic hydrogen on at least one of the carbons adjacent to the double bond carbons, which allylic hydrogen is not on a bridgehead carbon. An example of this type of unsaturation is illustrated by the structural unit

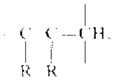

in which R is hydrogen or $C_1$-$C_6$ alkyl. Some polymers, such as certain ethylene—propylene—diene monomer rubbers, contain this type unsaturation already built into the polymer structure. However, in other instances, the olefinic unsaturation must be introduced into a base polymer. Exemplary of such base polymers are unsaturated polyesters and certain copolymers of ethylene and substituted dienes. Also, since esterification reactions may be used to introduce the olefinic unsaturation into polymers containing hydroxyl groups, the base polymers may include polymers such as poly(vinyl alcohol) and poly(vinyl acetate) which has been partly hydrolyzed; partly or completely hydrolyzed copolymers of vinyl acetate with other vinyl monomers such as vinyl chloride; cellulose ethers and cellulose esters; starch; cellulose which has been partially or completely reacted with an alkylene oxide such as ethylene oxide or propylene oxide, for example, hydroxyethyl cellulose or hydroxypropyl cellulose; phenoxy resins and other resins prepared by condensing a polyhydroxy compound with epichlorohydrin; polymers or copolymers of hydroxyalkyl acrylates or methacrylates; polymers or copolymers of hydroxyalkyl vinyl sulfides; and polymers or copolymers of hydroxyalkyl acrylamides.

The reactant utilized to introduce the extralinear olefinic unsaturation into the base polymer must provide allylic hydrogen to the product polymer, that is, the latter must contain at least one hydrogen on at least one of the carbons adjacent to the double bond carbons, which allylic hydrogen is not on a bridgehead carbon. Furthermore, it is necessary in the product polymer that there be no more than one hydrogen atom on each of the double bond carbons. The choice of reactant will depend upon the reaction involved in preparing the product polymer. Thus, if the reaction is one of addition polymerization, 1,3-butadiene, isoprene and 2,3-dimethyl-1,3-butadiene will not provide satisfactory products, whereas they will when used in a Diels-Alder reaction, as with an unsaturated polyester. In an addition polymerization reaction it is necessary to use a reactant such as 5-ethylidene-2-norbornene to obtain the desired extralinear unsaturation. In an esterification reaction, it is only necessary that the acid, acid halide, acid anhydride or ester reactant contain the desired unsaturation somewhere in the molecule. Thus, depending upon the reaction involved, suitable reactants are exemplified by those which provide olefinic units such as those existing in butene-2, trimethyl ethylene, tetramethyl ethylene, 1,2-dimethyl cyclohexene, 2-ethylidene-norbornane, 2-methyl-2-norbornene, 2,3-dimethyl-2-norbornene, cyclopentene, 1-methyl cyclopentene, 1,2-dimethyl cyclopentene, $\alpha,\beta,\beta'$-trimethyl styrene, indene and alkyl-substituted indenes, and alkyl substituted furans.

More generally, suitable reactants for introducing the extralinear olefinic unsaturation into the base polymer are exemplified by those which provide olefinic units corresponding to those of the general formula

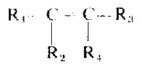

wherein $R_1$, $R_2$, $R_3$ and $R_4$ substituents may be hydrogen, an alkyl group containing 1 to 6 carbon atoms, an aryl group or a substituted aryl group. Furthermore, $R_1$ and $R_2$, $R_3$ and $R_4$, $R_1$ and $R_3$ and $R_2$ and $R_4$ may be combined in the form of an alicyclic or heterocyclic ring. However, one of the R's must contain the

group in order that at least one allylic hydrogen atom is present, and the carbon in this group cannot be a bridgehead carbon. Also, at any one time, when any of the R's is hydrogen, there can be no more than one hydrogen on each of the double bond carbons.

When the R's are alkyl, they may be straight chain alkyl, such as methyl, ethyl, n-propyl, n-butyl, n-amyl, n-hexyl or octadecyl. Moreover, one of them may be a branched chain alkyl, such as isopropyl, isobutyl, t-butyl and isoamyl, as long as none of the remaining R's is branched. Also, one of the R's may be an unsaturated alkyl group containing a carbon-carbon double bond in conjugation with the olefinic double bond. When the R's are aryl, there normally will be no more than two of them which are aryl, and they ordinarily will be singly substituted on the double bond carbons. The aryl substituents, such as phenyl and naphthyl, also may themselves be substituted with —R′, —OR′, $$-NHC(=O)-OR',$$

—Cl, —Br and —F substituents, wherein R′ is an alkyl group containing 1 to 6 carbon atoms, or is aryl, such as phenyl. Furthermore, if only one of the R's is aryl, then the aryl group may contain a $$-CN,\ -C(=O)-R',\ -C(=O)-OR',\ -OC(=O)-R' \text{ or } -OC(=O)-NHR'$$

substituent. These same substituents, plus the $$-NHC(=O)-OR',$$

—Cl, —Br and —F substituents listed earlier, also may occur elsewhere in the polymer molecule provided they are separated from the extralinear olefinic unsaturation in the polymer by at least 1 carbon atom, and preferably by 2 or more carbon atoms.

The sensitizers used in the process of this invention are generally well known and are characterized as being useful in photosensitized oxidations. Thus, they are photooxygenation sensitizers. Among the best sensitizers are those which absorb visible light, in the range of about 4,000 to about 8,000 angstroms, namely fluorescein derivatives, xanthene dyes, porphyrins and porphins, polycyclic aromatic hydrocarbons, and phthalocyanines. The sensitizers which are preferred are methylene blue and zinc tetraphenylporphin. Additional useful sensitizers are: erythrosin B; rose bengal; eosin Y; crystal violet; methylene green; safrin bluish; 1,1-diethyl-1,2,2'-cyanine iodide; 1-ethyl-2[3-(1-ethyl-naphtho-[1,2d]-thiasolin-2-ylidene-2-methyl-propenyl]-naphthol-[1,2a]-thiazolium bromide; pinacyanol chloride; ethyl red; 1,1'-diethyl-2,2'-dicarbocyanine iodide; 3,3'-diethyloxycarbocyanine iodide; 3,3'-diethyl-thiazolino carbocyanine iodide; fluorescein; methylene violet; methylene blue oleate; methylene blue dodecyl benzene sulfonate; copper phthalocyanine; pentacene; naphthacene; copper tetraphenylporphin; tin tetraphenylporphin; acridine orange; methylene violet, Bernthsen; hemin; chlorophyll; prophyrazines; octaphenylporphins; benzoporphins; hypericin; 3,4-benzpyrene; acridine; rubrene; 4,4'-bis(-dimethylamino) benzophenone; fluorenone; anthraquinone; and phenanthrenequinone.

The amount of sensitizer is not critical, but the best results are obtained when the concentration is adjusted so that 50 to 90% or more of the incident light is absorbed at the wavelength corresponding to the absorption maximum of the particular sensitizer employed. The sensitizer may be applied as a surface coating to the photopolymer film, diffused into the film with a suitable solvent, or incorporated into the polymer when the film is being formed.

In the preparation of some of the photopolymer components used in the process of this invention it may be desirable to have present a small amount of a phenolic antioxidant to act as an inhibitor for possible thermal oxidation reactions. Such antioxidants are well known in the art and they are exemplified by hydroquinone, di-t-butyl-p-cresol, hydroquinone monomethylether, pyrogallol, quinone, t-butyl-catechol, hydroquinone monobenzylether, methyl hydroquinone, amyl quinone, amyloxy hydroquinone, n-butyl phenol, phenol and hydroquinone monopropyl ether. The phenolic antioxidant may be used in an amount within the range of from about 0.001 to about 2% by weight, preferably about 1% by weight, based on the base polymer component.

The photopolymer compositions of the process of this invention may be cast from solution onto a suitable support. Ordinarily, the support member of a lithographic plate is metalsurfaced or composed of entire sheets of metal. Metals such as aluminum, zinc, copper, chromium, tin, magnesium and steel may be used. Aluminum and zinc are preferred. However, other supports or backing members may be employed, such as polyester film, cardboard or paper. For example, a paper sheet or plate suitably backed or the paper sheet impregnated with a thermosetting resin such as a phenol-formaldehyde resin may be employed. In the case of metallic surfaces, oxides may be present, either through exposure to air or through special treatment. For example, in the case of aluminum, the surface may, if desired, be chemically or electrolytically anodized. In casting the polymer component onto a suitable support, a suitable solution of the polymer component may be used, and conventional coating techniques may be employed.

Alternatively, those photopolymer compositions of the process of this invention which are thermoplastic may be thermoformed in plastic fabrication equipment onto a metal or synthetic resin substrate. In so doing, up to 60% by weight of an inert particulate filler may be added. Representative fillers are the organophilic silicas, the bentonites, silica and powdered glass, such fillers preferably having a particle size of 0.1 micron or less. The ingredients of the composition may first be dry-blended and then further mixed by two-roll milling or extrusion. This mixture then is fabricated into, for example, a lithographic plate by compression molding or extrusion onto a metal or synthetic resin backing.

With appropriate selection of sensitizer, the oxidation reaction in the selectively exposed portions of the plastic plate may be carried out using light having a wave length of from about 2,000 to about 12,000 angstroms, preferably from about 3,900 to about 7,700 angstroms. The oxygen required for the reaction normally is obtained from the air present. However, an atmosphere of pure oxygen may be provided, if desired.

After the polymer hydroperoxides have been formed in the first step of the process of this invention, the subsequent procedure involves contacting the polymer hydroperoxides with a vinyl monomer containing a hydrolyzable silane group in the presence of a redox catalyst. The preferred redox catalysts are salts or complexes of metals capable of existing in more than one valence state. Vanadium oxyacetylacetonate, vanadium oxysulfate, titanyl acetylacetonate, ferric acetylacetonate-benzoin, manganese octoate, lead naphthenate and cobaltic acetylacetonate are among the preferred redox catalysts, which also include cobaltous naphthenate, cobaltous 2-ethyl hexanoate, cobaltous stearate, cobaltic stearate, cobaltous acetylacetonate, manganous stearate, manganic stearate, manganous acetylacetonate, manganic acetylacetonate, manganese naphthenate, zirconium acetylacetonate, vanadyl naphthenate, ferrous sulfate, ferrous pyrophosphate, ferrous sulfide, the ferrous complex of ethylenedinitrilotetraacetic acid, ferrous o-phenanthroline, ferrous ferrocyanide, ferrous acetylacetonate and the corresponding nickel, copper, mercury and chromium compounds. Reducing agents which can also be used include polyamines such as diethylenetriamine, triethylenetetraamine, tetraethylenepentamine, monoamines, sodium hyposulfite and sulfur dioxide. Grafting in the presence of the vinyl monomer can also be initiated thermally.

The redox catalyst, reducing agent or heat acts upon the hydroperoxide groups on the polymer to decompose them to provide a free radical source for the initiation of graft polymerization of the vinyl monomer at the site of the hydroperoxide groups on the polymer. Any hydrolyzable silane-substituted vinyl monomer or mixture of monomers capable of being polymerized in a catalysthydroperoxide initiated reaction may be grafted to the polymer film.

The vinyl silane compound can be coated on the oxidized polymer surface in a number of ways, as for example, by dipping, brushing, rolling, etc., a solution or dispersion of the compound. Typical solvents for the vinyl silane compounds are methanol, methylene chloride, acetone, methyl ethyl ketone or combinations of these solvents. Since the silane groups are to be amplified, it is only necessary to coat with a very thin layer of silane compound — essentially a sufficient amount to react with the hydroperoxide groups.

The vinyl silane groups to be grafted to the olefin organic polymer substrate will in general have the formula $$(X)_a-\overset{(T)_b}{\overset{|}{Si}}-(R-Z)_c$$

where R is absent or is an organic radical, X is selected from halo, mono and dialkylamino, alkyl and arylamido, alkoxy, aryloxy and alkyl and aryl oxycarbonyl radicals and the corresponding halogenated radicals; T is selected from alkyl, cycloalkyl, aryl, alkaryl and aralkyl radicals and the corresponding halogenated radicals; where most preferably the alkyl groups will contain 1 to 18 carbon atoms, the cycloalkyl groups will contain 5 to 8 carbon atoms, and the aryl groups will contain 1 to 2 rings; *a* is an integer from 1 to 3; *b* is an integer from 0 to 2; *c* is an integer from 1 to 2; and *a+b+c* equals 4; and Z is selected from $-CH=CH_2$ and $$-O-\underset{\overset{\|}{O}}{C}-\underset{\overset{|}{R'}}{C}=CH_2$$

where R' is H or $-CH_3$.

Most preferably, R will be an organic radical selected from the group consisting of alkylene, cycloalkylene, arylene, alkarylene, aralkylene, alkyl diarylene, aryl dialkylene, alkyl dicycloalkylene, cycloalkyl dialkylene, alkylene-oxy-alkylene, arylene-oxy-arylene, alkarylene-oxy-arylene, alkarylene-oxy-alkarylene, aralkylene-oxy-alkylene, and aralkylene-oxy-aralkylene; as well as the corresponding halogenated radicals, where the alkyl and alkylene groups will contain 1 to 18 carbon atoms, the cycloalkyl and cycloalkylene groups will contain 5 to 8 carbon atoms, and the aryl and arylene groups will contain 1 to 2 rings.

Typical vinyl silane compounds are:

| | |
|---|---|
| $(H_3CO)_3-Si-(CH_2)_3-O-\underset{\overset{\|}{O}}{C}-\overset{CH_3}{C}=CH_2$ | γ-methacryloxytrimethylene-trimethoxysilane |
| $(H_3CO)_3-Si-(CH_2)_3-O-\underset{\overset{\|}{O}}{C}-CH=CH_2$ | γ-acryloxytrimethylene-trimethoxysilane |
| $[CH_3(CH_2)_3O]_3-Si-(CH_2)_3-O-\underset{\overset{\|}{O}}{C}-CH=CH_2$ | γ-acryloxytrimethylene-tributoxysilane |
| $[CH_2Cl(CH_2)_3O]_3-Si-(CH_2)_3-O-\underset{\overset{\|}{O}}{C}-CH=CH_2$ | γ-acryloxytrimethylene-trichlorobutoxysilane |
| $[CH_3(CH_2)_{17}O]_3-Si-(CH_2)_3-O-\underset{\overset{\|}{O}}{C}-CH=CH_2$ | γ-acryloxytrimethylene-trioctadecoxysilane |
| $(H_3C-CH_2-O)_3-Si-CH=CH_2$ | vinyl-triethoxysilane |
| $H_2C=CH-Si-Cl_3$ | vinyl-trichlorosilane |
| $(H_3C-\overset{\overset{O}{\|}}{C}-O)_3-Si-CH=CH_2$ | triacetoxy-vinylsilane |
| $(H_3CO)_3-Si-(CH_2)_2-CH=CH_2$ | 1-butenyl-trimethoxysilane |
| 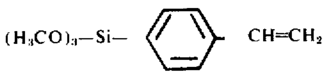 | p-vinylphenyltrimethoxysilane |
| 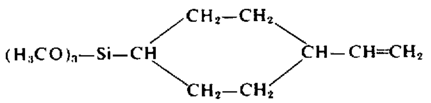 | 4-vinylcyclohexyltrimethoxysilane |
| 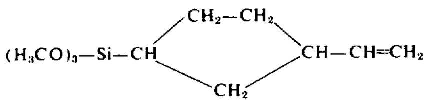 | 3-vinylcyclopentyltrimethoxysilane |
| 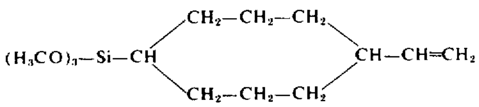 | 5-vinylcyclooctyltrimethoxysilane |
| $(H_3CO)_3-Si-(CH_2)_{16}-CH=CH_2$ | 1-octadecenyl-trimethoxysilane |
| 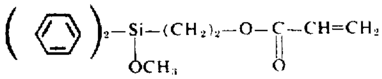 | β-acryloxyethylenediphenylmethoxysilane |

-continued

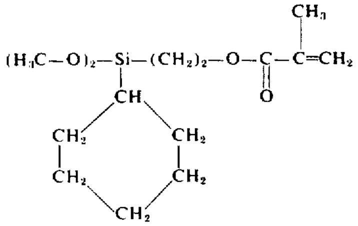

β-methacryloxyethylenecyclohexyl dimethoxysilane

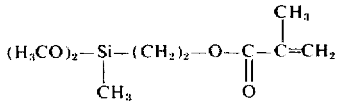

β-methacryloxyethylene-methyl-dimethoxysilane

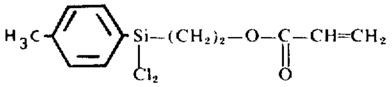

β-acryloxyethylenedichloro-p-toluylsilane

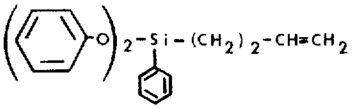

1-butenyl-phenyl-diphenoxysilane

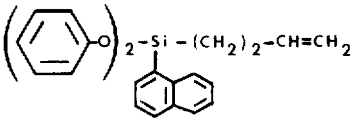

1-butenyl-naphthyl-diphenoxy-silane

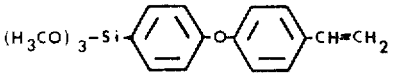

4-vinyl-4'-trimethoxysilane diphenyl ether

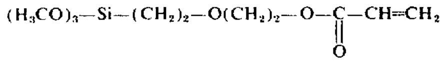

β-acryloxyethoxyethyl-trimethoxysilane

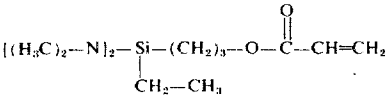

γ-acryloxytrimethylene-bis-(dimethylamino)-ethylsilane

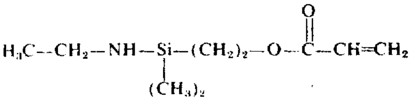

β-acryloxyethylene-ethylamino-dimethylsilane

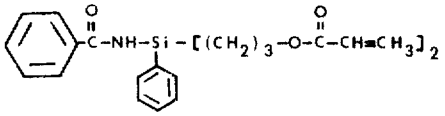

bis(γ-acryloxytrimethylene phenyl-benzamidosilane

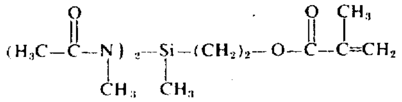

β-methacryloxyethyl-methyl-bis (N-methylacetamido)silane $(H_3CO)_2-Si-[(CH_2)_2-CH=CH_2]_2$ bis(1-butenyl)-dimethoxysilane

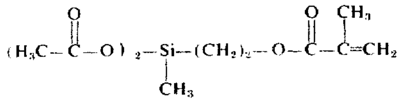

β-methacryloxyethylene-methyl-diacetoxysilane

After graft polymerization of the silane compound onto light-exposed areas of the polymer plate has been effected, ungrafted silane-compound can be removed from the unexposed areas by washing with a solvent. Typically, the same type of solvent would be used for removing unreacted unsaturated silane compound as is used for applying it to the film.

The grafted silane groups are then hydrolyzed to develop their hydrophilic characteristics. This reaction can be effected by treatment with water or an aqueous solution, preferably slightly acidic or basic, for a short time at room temperature or at a slightly elevated temperature. Then the graft polymer will have its hydrophilic properties enhanced by amplification. The hydrolyzed silane groups on the photografted silane compound are treated with a silicate solution or a colloidal silica suspension to amplify their hydrophilicity. Any water-soluble silicate, including both alkali and quaternary ammonium salts, can be used, as well as any silica which can form a colloidal suspension. In some cases it may be desirable to use a mixture of silicate and colloidal silica. There is not a definite distinction between soluble silicates and colloidal silicas, the difference between the two classes of materials being arbitrary. Soluble silicates range from the alkali metal orthosilicates ($2M_2O.SiO_2$, M = alkali metal), sesquisilicates ($3M_2O.2SiO_2$), and metasilicates ($M_2O.SiO_2$) through higher molecular weight polysilicates with high average $SiO_2/M_2O$ ratios. As the $SiO_2/M_2O$ ratio increases, aqueous solutions become more viscous. At still higher ratios, the silicates give the typical opalescence and bluish cast due to light scattering. The system can at this point be considered an aqueous colloidal dispersion of discrete particles of surface hydroxylated silica. The choice of alkali metal, pH, and concentration of aluminum oxide or other chemical modifiers affects the $SiO_2/M_2O$ ratio at which a true colloid may be said to exist. When a colloid is formed, the $SiO_2/M_2O$ ratio is so high that the bulk of the amorphous masses which have formed is high-purity $SiO_2$. The surface of the particles are made up of —SiOH and $—SiO^-M^+$ functionality. The positive ions are in solution. The charge layers at each particle surface repel one another, stabilizing the sol. soluble and colloid silicates can also be prepared with other monovalent positive counter ions in addition to the alkali metals, for example, quaternary ammonium salts, such as tetraethylammonium and tetraethanolammonium silicates, and other ammonium derivatives. Typical alkali metal silicates are sodium silicate, potassium silicate, lithium silicate. Typical commercial colloidal silicas are Ludox HS-40, HS, LS, SM-30, TM, AS, and AM (DuPont). These materials vary in colloidal particle size, pH, stabilizing ion, $SiO_2/M_2O$ ratio, etc.

The silicate or silica amplifying agents can be applied to the previously photografted surfaces by a number of methods. By one method, the photografted polymer plate is merely soaked in a silicate solution or colloidal suspension of silica. Soaking for a period of from about 1 minute to as much as several hours at a temperature from room temperature to about 90°C. will generally be sufficient. Other methods of applying the silicate or silica amplifying agents are wiping, brushing or pouring the solution or suspension onto the plate surface. The amount of amplifying agent applied will be sufficient to react with all the silane groups photografted on the polymer substrate. In general, solutions of silicates or suspensions of colloidal silica will contain from about 1% to about 40%, by weight of amplifier.

Periodic retreatment of the plate after use may be desirable to restore the hydrophilic properties.

The process of this invention is advantageous in that it is possible to utilize low light levels. One reason for this is that the process is not inhibited by oxygen during the exposure step. Also, since amplification is utilized to increase the mass and the hydrophilic character of the light-struck areas of the polymer film, the intensity of the light needed to obtain an image is decreased. Furthermore, low levels of visible light are operative, thus making it possible to prepare printing plates by projection of a photographic transparency. The process also is applicable to preparation of lithographic camera plates. In this procedure, the copy is exposed to light, the light being absorbed in the dark areas of the copy and reflected by the light areas. The reflected light is passed through a lens system and projected onto the surface of the sensitized polymer film, resulting in photooxidation in the light-struck areas.

The process of this invention is illustrated more specifically by the following examples. In these examples, all parts and percentages are by weight unless otherwise specified.

EXAMPLE 1

Propoxylated bisphenol-A fumarate polyester resin of M.W. 3000 (Atlac 382E) was modified with 2,3-dimethyl-1,3-butadiene (DMB) in a Diels-Alder reaction. Twenty-five grams Atlac 382E (0.059 mol unsaturation) and 9.70 g. of DMB (0.118 mol, 100% excess), were dissolved in 25.0 g. of reagent grade toluene in a 200.0 ml. polymerization bottle. The reaction was run under air. To prevent crosslinking of the polyester, about 1% hydroquinone was added as an inhibitor. The reaction mixture was heated at 100°C. for 24 hours. (Analysis for unreacted DMB by gas-liquid chromatography indicated the reaction was complete after 22.5 hours.) The polymer was precipitated by pouring the reaction mixture into about 800.0 ml. of rapidly stirring hexane. The solvent was decanted and the gummy polymer was redissolved in benzene, filtered through glass wool, reprecipitated by pouring into hexane, and dried. A study of the product by nuclear magnetic resonance indicated the polyester was modified 100 ± 4% with DMB. The polymer contains units of the following structure:

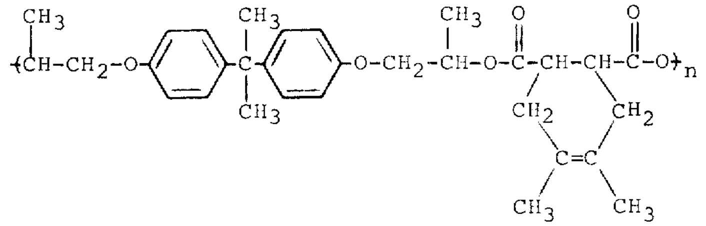

Films of this polymer were prepared and crosslinked through its terminal groups with a trifunctional isocyanate. The following procedure was used: 1.80 g. of the polymer 0.50 g. of the reaction product of three mols of hexamethylene diisocyanate and one mol of water, named as the biuret of hexamethylene diisocyanate and composed principally of a compound believed to have the structure:

$$OCN-(CH_2)_6-N-\left[\overset{\overset{O}{\|}}{C}-NH(CH_2)_6-NCO\right]_2$$

and 0.50 g. zinc octoate (8% Zn) were dissolved under a dry nitrogen atmosphere in 2.70 g. of Cellosolve acetate. This solution was used to cast films on 8 inch × 8 inch × 0.003 inch sheets of hard aluminum foil using a 10 mil. casting knife. The films were cured at 130°C. for one and a half hours. Casting and curing operations were carried out under a dry nitrogen atmosphere. Cured film thickness was about three to four mils.

The cured films then were brush-coated with a methanol solution of erythrosin B sensitizer ($3.22 \times 10^{-3}$ mol./l). Sensitizer concentration was about $5.4 \times 10^{-8}$ mol./cm.$^2$. The films were covered with a photographic transparency and taped to the surface of a glass vessel containing ice water; additional cooling was provided by an air blower. The films were exposed for 60 seconds from a distance of 30 cm. to a Sylvania Super 8 Sun-Gun movie light with a DVY 650 watt tungsten halogen lamp. Immediately following exposure the transparency was removed and the films were wiped with a methanol-soaked nonwoven fabric to remove the sensitizer.

A grafting solution was prepared from 15.0 g. of γ-methacrylonyltrimethylene-trimethoxysilane (MOTTMS), 0.150 g. of vanadium oxyacetylacetonate (1.0% based on monomer), and 45.0 g. of anhydrous methanol. The resulting solution, containing 25% by weight of MOTTMS, was degassed at −70°C. by evacuation-nitrogen flush cycles. The exposed films were placed in a shallow dish, under a nitrogen atmosphere, and covered with the grafting solution. After 14 minutes contact, the films were removed and rinsed well with methanol to remove any residual monomer.

A sharp, grafted image was clearly visible. The films were wiped with an acidic natural gum aqueous solution and covered with a nonwoven fabric which was subsequently soaked with the gum solution. After 10 minutes, the wipe was removed and the films were rinsed with water and dried.

The film, after treatment with the gum aqueous solution, was soaked in potassium silicate aqueous solution for one hours. The film when tested on the lithographic press printed with good half-tone definition and good ink hold-out in the light-struck areas.

EXAMPLE 1a

This example illustrates amplification by use of a silicate at lower concentration.

A plate was prepared as in Example 1, except the amplification procedure was modified as follows. The imaged plate was soaked in a 5% solution of potassium silicate for 30 minutes. The plate was run on a lithographic press with satisfactory results.

EXAMPLE 1b

This example illustrates the retreatment of a deteriorated lithographic plate with a silicate solution to restore performance.

The process of Example 1a was repeated. The resulting plate was allowed to run on a lithographic press until the hydrophilic areas began to deteriorate by scumming. The press was stopped and ink removed from the plate with solvent. The plate was then rubbed vigorously with a pad saturated with a 13% aqueous solution of potassium silicate. After five minutes, the excess silicate solution was wiped off with a water-soaked pad. The press was restarted. The printing was satisfactory showing that the hydrophilic areas of the plate had been restored.

EXAMPLE 2

This example illustrates grafting of a vinyl silane to light-struck areas of an unsaturated polyester resin substrate and then amplifying with a combination of silicate and silica.

The procedure of Example 1 was repeated exactly except the soaking in potassium silicate solution was replaced by soaking for 5 hours in a 1:1 mixture of 39% aqueous potassium silicate solution and 30% colloidal sodium ion stabilized silica dispersion (containing 30.0% $SiO_2$ and 0.2% $Al_2O_3$ with a $SiO_2/Na_2O$ weight ratio of 230 dispersed as 13–14 mμ diameter particles in water). The plate was run on a lithographic press for over 3000 impressions with satisfactory results.

EXAMPLE 3

This example illustrates grafting of a vinyl silane to light-struck areas of a crosslinked polyester resin substrate and then amplifying with an organic colloidal silica.

The procedure of Example 1 was repeated exactly except the soaking in potassium silicate was replaced by soaking for 5 hours in a 15% ammonium ion stabilized silica dispersion (containing 15.0% $SiO_2$ with a $SiO_2/NH_3$ weight ratio of 120 dispersed as 13 to 14 mμ particles in water). The plate was run on a lithographic press for over 3000 impressions with satisfactory results.

EXAMPLES 4–13

These examples illustrate grafting of a vinyl silane to light-struck areas of a crosslinked polyester resin substrate and then amplifying with a variety of colloidal silicas and silicates.

The procedure of Example 3 was repeated exactly except the colloidal ammonium silicate is replaced by other silicate solutions or silica dispersions.

| Ex. No. | Form | $SiO_2$ Conc. | Counter ion | $SiO_2/M_2O$ wt. ratio | Particle Size |
|---|---|---|---|---|---|
| 4 | colloidal silica | 40.0 % | sodium | 93 | 13–14 mμ |
| 5 | colloidal silica | 30.0 | sodium | 300 | 15–16 |
| 6 | colloidal silica | 30.0 | sodium | 50 | 7–8 |
| 7 | colloidal silica | 49.0 | sodium | 230 | 13–14 |
| 8 | colloidal silica surface modified with aluminum | 30.0 | sodium | 230 | 13–14 |
| 9 | silicate solution | 33.2 | sodium | 2.4 | — |
| 10 | silicate solution | 20.8 | potassium | 2.5 | — |
| 11 | silicate solution | 29.5 | potassium | 1.8 | — |
| 12 | silicate solution | 20.0 | lithium | 9.6 | — |
| 13 | silicate solution | 30.0 | tetra-ethanol ammonium | 7.5 | — |

Each plate was run on a lithographic press for over 3000 impressions with satisfactory results.

EXAMPLE 14

This example illustrates the use of a tri-substituted, extralinear unsaturated polymer substrate. Atlac 382E (described in Example 1) was modified 95± 5% with isoprene in a Diels-Alder reaction. The polymer contains units of the following structure:

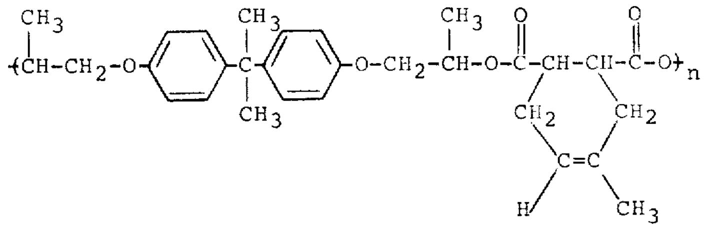

Films of the polymer, prepared and crosslinked as described in Example 1, were brush coated with meso-tetraphenylporphin and exposed for 120 seconds as outlined in Example 1. Grafting with the 25% MOTTMS solution of Example 1, followed by the usual work up, gave sharp grafted images. The film, after treatment with the gum solution was amplified by soaking in 5% potassium silicate solution as in Example 1a. When tested on the lithographic press the film printed with good half-tone definition and good ink hold-out in the light-struck areas.

EXAMPLE 15

This example illustrates the grafting of a vinyl silane to a film of ethylene-propylene-ethylidenenorbornene terpolymer rubber (EPsyn 40-A EPDM, Copolymer Rubber and Chemical Corp.). In this example, the sensitizer was dissolved in the film.

The EPsyn 40-A EPDM rubber was purified by dissolving it in benzene and precipitating it with methanol. A 5.0% benzene solution of the purified rubber then was prepared and 0.50% (based on the rubber) of zinc-tetraphenylporphin was added. This solution was used to cast a film on a grained polyester substrate. An identical film of EPsyn 40-A EPDM was cast adjacent to the first, but this one contained no sensitizer. The films were exposed through a photographic transparency for 5 minutes from a distance of 60 cm. to a 375 watt Sylvania R32 photoflood lamp and contacted with a grafting solution prepared from 13 g. of vinyl-triethoxysilane, 0.13 g. of vanadium oxyacetylacetonate and 37 g. of anhydrous methanol. The grafting solution was degassed as previously described. After 62 minutes contact, followed by rinsing with methanol, the film containing sensitizer was visibly grafted in the light-struck areas. The film containing no sensitizer remained unchanged.

EXAMPLE 16

This example illustrates the use of a modified poly(vinyl alcohol) as the polymer substrate. The poly(vinyl alcohol) was modified with 1,2,4-trimethyl-4-chlorocarbonylcyclohexene to contain extralinear tetra-substituted double bonds.

Four grams of dried 88–89% hydrolyzed poly(vinyl acetate) of M.W. 10,000 and 100.0 ml. of dry dimethylformamide (DMF) were heated and stirred at 100°–110°C. under nitrogen until solution was achieved. Then, 7.05 g. (0.070 mol) of triethylamine was added. A solution of 12.9 g. (0.069 mol) of 1,2,4-trimethyl-4-chlorocarbonylcyclohexene in 10.0 ml. of dry DMF was added dropwise to the reaction mixture with rapid stirring at 105°–110°C. The solution was then allowed to stand for about 60 hours at ambient temperature. The reaction mixture was filtered and concentrated under vacuum. The gelatinous residue was dissolved in 100.0 ml. of hot acetone and poured into 400.0 ml. of rapidly stirring water. The liquid was decanted and the gum was washed thoroughly with pentane. The polymer was dissolved in acetone and precipitated again. The resulting orange, rubbery material was dried at 50°–60°C. under pump vacuum for about 12 hours.

Films were cast and crosslinked as described in Example 1. The following solution was prepared and used for film casting: 3.5 g. of the modified poly(vinyl alcohol); 0.55 g. of the trifunctional isocyanate described in Example 1; two drops of zinc octoate (8% Zn); and 10.0 ml. of Cellosolve acetate.

A sample film was coated with methylene blue, exposed, and grafted with MOTTMS as described in Example 1. The grafted film was soaked for 15 minutes in a solution of 5% potassium silicate. The light-struck areas were visibly grafted, producing a sharp image. Testing the film on a lithographic printing press showed effective ink hold-out in the light-struck areas.

EXAMPLE 17

This example illustrates the use of a modified phenoxy resin as the polymer substrate. The resin was modified with 1,2,4-trimethyl-4-chlorocarbonylcyclohexene to contain extralinear tetra-substituted double bonds.

Fourteen and two-tenths grams of dried phenoxy resin (M.W. 30,000, 0.050 mol hydroxyl) was dissolved in 150.0 ml. of methylene chloride under nitrogen. Then 4.80 g. (0.047 mol) of triethylamine was added. A solution of 8.76 g. (0.047 mol) of 1,2,4-trimethyl-4-chlorocarbonylcyclohexene in 10.0 ml. of methylene chloride was added dropwise to the reaction mixture at ambient temperature. The solution was allowed to stand for about four days. The polymer was precipitated by pouring the reaction mixture into 500.0 ml. of rapidly stirring methanol, redissolved in a minimum of methylene chloride and precipitated two more times, and finally dried at 50°–65°C. under pump vacuum for about 12 hours.

Films were cast and crosslinked as described in Example 1. The following solution was prepared and used for film coating: 4.25 g. of the modified phenoxy resin; 0.25 g. of the trifunctional isocyanate described in Example 1; one drop of zinc octoate (8% Zn); and 10.0 ml. of Cellosolve acetate.

A sample film was coated with methylene blue and exposed through a Stauffer 20 step Sensitivity Guide (AT 20 × 0.15) for 5 minutes from a distance of 60 cm. to a 375 watt Sylvania R32 photoflood lamp. During exposure the surface was cooled by an air blower. MOTTMS grafting was carried out as described in Example 1. A sharp grafted image was visible through Step No. 11.

EXAMPLE 18

This example illustrates the use of a modified hydroxypropyl cellulose as the polymer substrate. The cellulose derivative was modified with 1,2,4-trimethyl-4-chlorocarbonylcyclohexene to contain extralinear tetra-substituted double bonds.

Thirteen and four-tenths grams (0.060 mol hydroxyl) of dried hydroxypropyl cellulose (M.W. 75,000) was dissolved in 300.0 ml. of dry tetrahydrofuran (THF) under nitrogen. Then 4.0 g. (0.040 mol) of triethylamine was added. A solution of 11.2 g. (0.030 mol) of 1,2,4-trimethyl-4-chlorocarbonylcyclohexene in 10.0 ml. of dry THF was added dropwise to the reaction mixture at ambient temperature. The solution was heated at 40°C. for 30 hours and then allowed to stand for about 60 hours at ambient temperature. The reaction mixture was concentrated under vacuum and the polymer was precipitated by pouring into 1 liter of water. The rubbery material was redissolved in THF and precipitated again from water. The polymer was dried at 60°C. under pump vacuum for about 2 days.

Films were cast and crosslinked as described in Example 1. The following solution was prepared and used for film casting: 4.25 g. of the modified hydroxypropyl cellulose; 0.25 g. of the trifunctional isocyanate described in Example 1; one drop of zinc octoate (8% Zn); and 11.0 ml. of methylene chloride. Since methylene chloride was used as the solvent, the films were allowed to dry under nitrogen at room temperature for 1 to 2 hours before curing. The films were cured at 120°C. for 2 hours.

A sample film was sensitizer coated, exposed, and grafted as described in Example 17. A sharp image was produced through Step No. 7.

EXAMPLE 19

This example illustrates the use of a phenoxy resin modified with 4,5-dimethyl-4-hexen-1-ol as the polymer substrate.

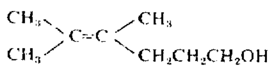

To a solution of 5.2 g. (0.03 mol) of 2,4-toluenediisocyanate in 15 ml. of dry ethyl acetate was added 3.8 g. (0.03 mol) of 4,5-dimethyl-4-hexen-1-ol. The solution was allowed to stand at room temperature for five days. Fifty milligrams of stannous octoate was added, and the solution refluxed for 3 hours.

The solvent was stripped off under reduced pressure and the residue added to a solution of 11.4 g. (0.04 eq. hydroxyl) of phenoxy resin (M.W. 30,000, 0.050 mol hydroxyl) and 0.05 g. of stannous octoate in 125 ml. of cellosolve acetate. The resulting solution was heated at 110°C. for 8 hours, cooled and poured into 500 ml. of methanol. The solids were separated and taken up in methylene chloride. The polymer was precipitated in hexane and dried under vacuum. Analysis indicated that about 20% of the available hydroxyls in the starting polymers had been reacted.

A two-mil corsslinked film of the above polymer was prepared by drawing out a solution of 3.0 g. of the polymer in 14 ml. of cellosolve acetate containing 0.20 g. of the trifunctional isocycanate described in Example 1 and 0.02 g. of zinc octoate, and baking at 130°C. for 1 ½ hours.

The cured film was soaked for 15 minutes in a solution of 0.80 g. of methylene blue in 50/50 chloroform/-benzene. The film was allowed to dry overnight and exposed as described in Example 17. The exposed film was grafted as described in Example 1 using a solution of 15 ml. of MOTTMS, 15 ml. of methanol, and 30 mg. of vanadium oxyacetylacetonate. Grafted material was observed through Step No. 12.

EXAMPLE 20

This example illustrates the use of an ethylene-vinyl alcohol copolymer modified with p-(2,3-dimethylprop-2-enyl) benzoyl chloride as the polymer substrate, γ-acryloxytrimethylene-trimethoxysilane as the grafting monomer.

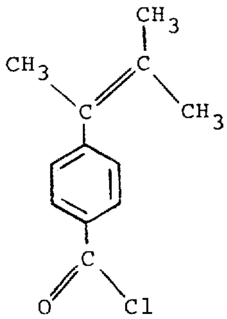

p-(2,3-Dimethylprop-2-enyl) benzoic acid was prepared according to the procedure of G. P. Newsoroff and S. Sternhell, Aust. J. Chem., 19, 1667 (1966). The benzoic acid was converted to the acid chloride, b.p. 112°C. (1.7 mm.), by treatment with thionyl chloride.

Dried ethylene-vinyl alcohol copolymer, 10.0 gm., $3.57 \times 10^{-2}$ mol hydroxyl) was dissolved in 100 ml. of refluxing benzene under nitrogen. After the polymer dissolved, the solution was allowed to cool to 65°C. and pyridine, 2.12 gm. ($2.68 \times 10^{-2}$ mol), was added. A solution of p-(2,3-dimethylprop-2-enyl) benzoyl chloride, 5.59 gm. ($2.68 \times 10^{-2}$ mol), in 10 ml. of benzene was added dropwise to the reaction mixture.

The mixture was then heated and stirred in an 80°C. oil bath for about 50 hours, and then stirred at ambient temperature for about three days. The polymer was precipitated by filtering the reaction mixture into 1600 ml. of rapidly stirring methanol. The white rubbery solid was isolated by filtration, redissolved in a minimum of benzene and precipitated two more times from methanol, and finally dried at ambient temperature under pump vacuum for about 12 hours.

Films were cast and crosslinked as described in Example 1. The following solution was prepared and used for film coating: 3.00 gm. of the modified polymer; 0.70 gm. of the trifunctional isocyanate described in Example 1; 0.070 gm zinc octoate (8% Zn); and 13.8 ml. of dried xylene.

A sample film was soaked for about 45 hours in 25/75 (vol./vol.) methanol/benzene containing 0.80 gm. of methylene blue per liter of solution. The film was dried under pump vacuum for about two hours and the film surface was gently wiped with a methanol soaked nonwoven fabric. The film was exposed through a Stauffer 21 Step Sensitivity Guide (No. AT 20 × 0.15) for 60 seconds from a distance of 60 cm. to a 375 watt Sylvania R32 photoflood lamp.

Immediately following exposure the step guide was removed and the film was degassed under pump vacuum for 15 minutes. The film was then grafted with a 28% solution of γ-acryloxytrimethylene-trimethoxysilane in methanol containing 0.40% vanadium oxyacetylacetonate (based on the monomer). The grafting procedure of Example 1 was followed but grafting was continued for 30 minutes. The grafted film was worked up with gum solution and amplified as described in Example 1. The resulting film printed a sharp image with good ink hold-out.

EXAMPLE 21

This example illustrates the use of a vinyl chloridevinyl alcohol copolymer modified with β-(5-methyl-2-furyl)-propionyl chloride as the polymer substrate.

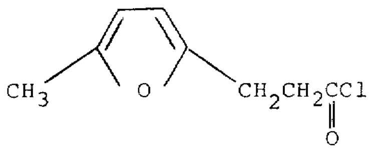

The vinyl chloride-vinyl alcohol copolymer was prepared by complete hydrolysis of a vinyl chloride-vinyl acetate copolymer, 13% vinyl acetate. The dried polymer (0.100 mol hydroxyl) was dissolved in dry tetrahydrofuran (THF) under nitrogen. Pyridine in the amount of 0.095 mol was added. A solution of β-(5-methyl-2-furyl) propionyl chloride in the amount of 0.095 mol in THF was added dropwise with stirring at ambient temperature. After 24 hours, the solution was concentrated and the polymer precipitated by pouring into water. After a second precipitation, the polymer was dried at 50°C. under pump vacuum for 1 day.

Films were cast and crosslinked as described in Example 1. A sample film was coated with methylene blue, exposed, soaked in methanol for several minutes, and grafted with MOTTMS, as described in Example 1. After rinsing with methanol, a sharp grafted image was visible. Amplification of the grafted film with a five percent aqueous solution of potassium silicate, as in Example 1a, gave a surface which printed effectively on a conventional lithographic press.

EXAMPLE 22

This example illustrates the use of a modified isophthalic polyester as the polymer substrate.

A polyester based on isophthalic and fumaric acids in a 1/1 mol ratio esterified with propylene glycol was modified essentially 100% with 2,3-dimethyl-1,3-butadiene in a Diels-Alder reaction as outlined in Example 1. Films of the modified polyester were cast, crosslinked, sensitizer coated, grafted, and amplified as described in Example 1. An image with excellent halftone definition was clearly visible.

EXAMPLE 23

This example illustrates the use of zinc tetraphenylprophin as a sensitizer with a vinyl silane as the grafting monomer. A 25 × 25 cm. polymer film of propoxylated bisphenol-A fumarate polyester modified with 2,3-dimethyl-1,3-butadiene, prepared and crosslinked as described in Example 1, was whirl coated (at about 150 R.P.M.) with a solution of 0.30 g. zinc tetraphenylporphin in 60 ml. of chloroform/methanol (50/50, vol.-/vol.). Excess sensitizer was removed from the film surface by wiping with a water soaked lintless cotton pad. A portion of the film was covered with a Stauffer 21 Step Sensitivity Guide No. (AT 20 × 0.15) and exposed for 10 minutes from a distance of 60 cm. to a 375 watt Sylvania R32 photoflood lamp. During exposure the film was cooled by an air blower. The film was contacted with a solution of 25% vinyl-triethoxysilane in methanol containing 0.25% vanadium oxyacetylacetonate. The solution was prepared and degassed as previously described. After 60 minutes contact and 30 minutes rinsing in methanol a grafted image was visible.

The grafted film was soaked for 30 minutes in a 6% potassium silicate solution in water. The film printed a good image with good ink hold-out through step No. 5.

EXAMPLES 24–28

These examples illustrate the use of ultraviolet light to initiate the selective oxidation of exposed surfaces of the film. Sensitizers effective in absorbing ultraviolet light are employed in these cases. In each of these examples the polymer was cast and crosslinked as in Example 1, coated with a solution of the sensitizer indicated, and exposed through a photographic transparency to a G.E. 275 watt Sunlamp from a distance of eight inches. The exposed films were grafted with MOTTMS, treated with gum solution and amplified with potassium silicate, all as described in Example 1. Each printed effectively when tested on a conventional lithographic printing press.

| Ex. No. | Polymer | Sensitizer | Exposure Time (minutes) | Printing Effective Through Step No. |
|---|---|---|---|---|
| 24 | As described in Example 14 | Michler's ketone | 5 | 4 |
| 25 | As described in Example 1 | benzophenone | 10 | 14 |
| 26 | As described in Example 1 | chrysene | 10 | 10 |
| 27 | As described in Example 14 | phenanthrene | 10 | 7 |
| 28 | As described in Example 20 | phenanthrene | 15 | 8 |

EXAMPLES 29–43

These examples illustrate employment of various vinyl silane monomers with hydrolyzable groups grafted to selectively photooxidized polymer films for the preparation of lithographic printing plates. The procedures of Example 1 were employed, substituting different vinyl silane monomers and different sensitizers as indicated below. In each case a visible image resulted from the grafting, corresponding to the pattern of the transparency through which the film was exposed. Also in each case the printing was improved as a result of the amplification treatment.

| Ex. | Sensitizer | Vinyl Silane Monomer |
|---|---|---|
| 29 | Methylene Blue | vinyl-triethoxysilane |
| 30 | Methylene Blue | vinyl-trichlorosilane |
| 31 | Methylene Blue | triacetoxy-vinylsilane |
| 32 | Methylene Blue | 1-butenyl-trimethoxysilane |
| 33 | Methylene Blue | β-acryloxyethylene-diphenyl-methoxysilane |
| 34 | Methylene Blue | β-methacryloxyethylene-cyclohexyldimethoxysilane |
| 35 | Methylene Blue | β-methacryloxyethylene-methyl-dimethoxysilane |
| 36 | Zinc tetra-phenylporphin | β-acryloxyethylene-dichloro-p-toluylsilane |
| 37 | Zinc tetra-phenylporphin | 1-butenyl-phenyl-diphenoxysilane |
| 38 | Zinc tetra-phenylporphin | γ-acryloxytrimethylene-bis-(dimethylamino)-ethylsilane |
| 39 | Zinc tetra-phenylporphin | β-acryloxyethylene-ethylamino-dimethylsilane |
| 40 | Zinc tetra-phenylporphin | bis(γ-acryloxytrimethylene)-phenylbenzamidosilane |
| 41 | Zinc tetra-phenylporphin | β-methacryloxyethyl-methyl-bis(N-methylacetamido)silane |
| 42 | Zinc tetra-phenylporphin | bis(1-butenyl)-dimethoxysilane |
| 43 | Zinc tetra-phenylporphin | β-methacryloxyethylene-methyl-diacetoxysilane |

What we claim and desire to protect by Letters Patent is:

1. The process of making a photographic image which comprises providing the surface of a polymer film with a photooxygenation sensitizer, said film being a film of a polymer containing extralinear olefinic unsaturation of the type in which there is no more than one hydrogen atom on each of the double bond carbons and in which there is at least one allylic hydrogen on at least one of the carbons adjacent to the double bond carbons, which allylic hydrogen is not on a bridgehead carbon, exposing selected areas of the sensitized film to light having a wave length of from about 2000 to about 12,000 angstroms in the presence of oxygen, subjecting the exposed film to contact with a vinyl monomer containing a hydrolyzable silane group to effect graft polymerization of the vinyl silane monomer onto light-exposed areas of the polymer film, removing ungrafted vinyl silane monomer from unexposed areas of the polymer film, hydrolyzing the silane groups of the vinyl silane monomers grafted to the polymer film, and amplifying the hydrophilicity of the hydrolyzed silane groups by treating with at least one amplifying agent selected from soluble silicate solutions and colloidal silica dispersions.

2. The process of claim 1 wherein the light has a wave length of from about 3900 to about 7700 angstroms.

3. The process of claim 1 wherein the amplifying agent is a soluble silicate.

4. The process of claim 1 wherein the amplifying agent is colloidal silica.

5. The process of claim 1 wherein the amplifying agent is a mixture of a soluble silicate and colloidal silica.

6. A photopolymer element prepared according to the process of claim 1.

7. The photopolymer element of claim 6 wherein the element is a lithographic plate.

8. In a process of preparing a lithographic printing plate which comprises providing the surface of a polymer film with a photooxygenation sensitizer, said film being a film of a polymer containing extralinear olefinic unsaturation, exposing the sensitized film imagewise to light in the presence of oxygen, the improvement of contacting the exposed film with a vinyl monomer containing a hydrolyzable silane group to effect graft polymerization of the vinyl silane monomer onto light-exposed areas of the polymer film, removing ungrafted vinyl silane monomer from unexposed areas of the polymer film, hydrolyzing the silane groups of the vinyl silane monomers grafted to the polymer film, and amplifying the hydrophilicity of the hydrolyzed silane groups by treating with at least one amplifying agent selected from soluble silicate solutions and colloidal silica dispersion.

* * * * *

UNITED STATES PATENT AND TRADEMARK OFFICE
CERTIFICATE OF CORRECTION

PATENT NO. : 3,924,520

DATED : December 9, 1975

INVENTOR(S) : Boardman, Breslow, Simpson and Wagner (Case 1)

It is certified that error appears in the above-identified patent and that said Letters Patent are hereby corrected as shown below:

Column 7 of Printed Patent; Page 13 of Specification; "10" should be omitted from the formula which is the line number of the specification.

"10 $(H_3CO)_3$-Si-$(CH_2)_{16}$-CH=$CH_2$" should read

--$(H_3CO)_3$-Si-$(CH_2)_{16}$-CH=$CH_2$--

Signed and Sealed this

*sixteenth* Day of *March 1976*

[SEAL]

*Attest:*

RUTH C. MASON
*Attesting Officer*

C. MARSHALL DANN
*Commissioner of Patents and Trademarks*